US008380946B2

(12) United States Patent
Hetzler et al.

(10) Patent No.: US 8,380,946 B2
(45) Date of Patent: Feb. 19, 2013

(54) SYSTEM, METHOD, AND COMPUTER PROGRAM PRODUCT FOR ESTIMATING WHEN A RELIABLE LIFE OF A MEMORY DEVICE HAVING FINITE ENDURANCE AND/OR RETENTION, OR PORTION THEREOF, WILL BE EXPENDED

(75) Inventors: Steven Robert Hetzler, Los Altos, CA (US); William John Kabelac, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 475 days.

(21) Appl. No.: 12/420,647

(22) Filed: Apr. 8, 2009

(65) Prior Publication Data

US 2010/0262792 A1 Oct. 14, 2010

(51) Int. Cl.
*G06F 12/16* (2006.01)
(52) U.S. Cl. ................. 711/156; 711/E12.103
(58) Field of Classification Search ............... 711/156, 711/E12.103
See application file for complete search history.

(56) References Cited

U.S. PATENT DOCUMENTS

| 6,295,619 | B1 * | 9/2001 | Hasbun et al. ............ 714/719 |
| 7,103,746 | B1 | 9/2006 | Kulick ...................... 711/173 |
| 7,246,268 | B2 | 7/2007 | Craig et al. ................ 714/42 |
| 2006/0106972 | A1 * | 5/2006 | Gorobets et al. .......... 711/103 |
| 2007/0006048 | A1 | 1/2007 | Zimmer et al. ............ 714/42 |
| 2007/0180186 | A1 | 8/2007 | Cornwell et al. .......... 711/103 |
| 2007/0198786 | A1 | 8/2007 | Bychkov et al. .......... 711/154 |
| 2007/0266200 | A1 * | 11/2007 | Gorobets et al. .......... 711/103 |
| 2008/0177956 | A1 | 7/2008 | Peddle .................... 711/156 |
| 2008/0177974 | A1 | 7/2008 | Chiang et al. ............ 711/173 |

OTHER PUBLICATIONS

Degraeve et al., "Analytical model for failure rate prediction due to anomalous charge loss of flash memory" 2001 IEEE; pp. 32.1.1-32.1.4.
Okada, "A Model for Anomalous Leakage Current in Flash Memories and Its Application for the Prediction of Retention Characteristics" 2001 IEEE; pp. 32.3.1-32.3.4.

* cited by examiner

*Primary Examiner* — Yong Choe
(74) *Attorney, Agent, or Firm* — Zilka-Kotab, PC

(57) ABSTRACT

A method according to one embodiment includes gathering monitor data information from a memory device having finite endurance and/or retention, the monitor data being data of known content stored in dedicated memory cells of known write cycle count; analyzing the monitor data information; estimating a reliable life of the memory device or portion thereof based on the analysis; tracking a rate of change of at least a highest cycle count of user data; estimating when the reliable life of the memory device or portion thereof will be expended based on the tracking and the estimating; and taking an action prior to the reliable life of the memory device or portion thereof being expended. Additional systems, methods, and computer program products are also disclosed.

20 Claims, 12 Drawing Sheets

SYSTEM, METHOD, AND COMPUTER PROGRAM PRODUCT FOR ESTIMATING WHEN A RELIABLE LIFE OF A MEMORY DEVICE HAVING FINITE ENDURANCE AND/OR RETENTION, OR PORTION THEREOF, WILL BE EXPENDED

FIELD OF THE INVENTION

The present invention relates to memory devices, and more particularly, this invention relates to estimating when a reliable life of a memory device having finite endurance and/or retention will be expended.

BACKGROUND OF THE INVENTION

Some memory devices such as NAND flash memory devices possess finite write/erase endurance and/or limited data retention. Tracking the write/erase endurance and data retention is often desired to recognize a current usefulness and reliability of such memory. To date, however, proposed solutions have failed to provide acceptable solutions for these and/or other issues associated with such memory devices.

SUMMARY OF THE INVENTION

A method according to one embodiment includes gathering monitor data information from a memory device having finite endurance and/or retention, the monitor data, being data of known content stored in dedicated memory cells of known write cycle count; analyzing the monitor data information; estimating a reliable life of the memory device or portion thereof based on the analysis; tracking a rate of change of at least a highest cycle count of user data; estimating when the reliable life of the memory device or portion thereof will be expended based on the tracking and the estimating; and taking an action prior to the reliable life of the memory device or portion thereof being expended.

A computer program product according to one embodiment includes a computer usable medium having computer usable program code embodied therewith, the computer usable program code comprising: computer usable program code configured to gather monitor data information from a memory device having finite endurance and/or retention, the monitor data being data of known content stored in dedicated memory cells of known write cycle count; computer usable program code configured to analyze the monitor data information; computer usable program code configured to estimate a reliable life of the memory device or portion thereof based on the analysis; computer usable program code configured to track a rate of change of at least a highest cycle count of user data; computer usable program code configured to estimate when the reliable life of the memory device or portion thereof will be expended based on the tracking and the estimating; and computer usable program code configured to take an action prior to the reliable life of the memory device or portion thereof being expended.

A system according to one embodiment includes a plurality of memory devices having finite endurance and/or retention, each of the memory devices having: a plurality of memory blocks, at least one of the blocks having monitor data written therein, wherein the at least one block has been written to a plurality of times prior to writing the monitor data; and circuitry for addressing the blocks. The system further includes a processor in communication with the memory devices; a clock, the processor being in communication with the clock; and a computer usable medium, the computer usable medium having computer usable program code embodied therewith, which when executed by a processor causes the processor to: gather monitor data information from a memory device, the monitor data being data of known content stored in dedicated memory cells of known write cycle count; analyze the monitor data information; estimate a reliable life of the memory device or portion thereof based on the analysis; track a rate of change of at least a highest cycle count of user data; estimate when the reliable life of the memory device or portion thereof will be expended based on the tracking and the estimating; and take an action prior to the reliable life of the memory device or portion thereof being expended.

A system according to yet another embodiment includes logic for gathering monitor data information from a memory device having finite endurance and/or retention, the monitor data being data of known content stored in dedicated memory cells of known write cycle count; logic for analyzing the monitor data information; logic for estimating a reliable life of the memory device or portion thereof based on the analysis; logic for tracking a rate of change of at least a highest cycle count of user data; logic for estimating when the reliable life of the memory device or portion thereof will be expended based on the tracking and the estimating; and logic for taking an action prior to the reliable life of the memory device or portion thereof being expended.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
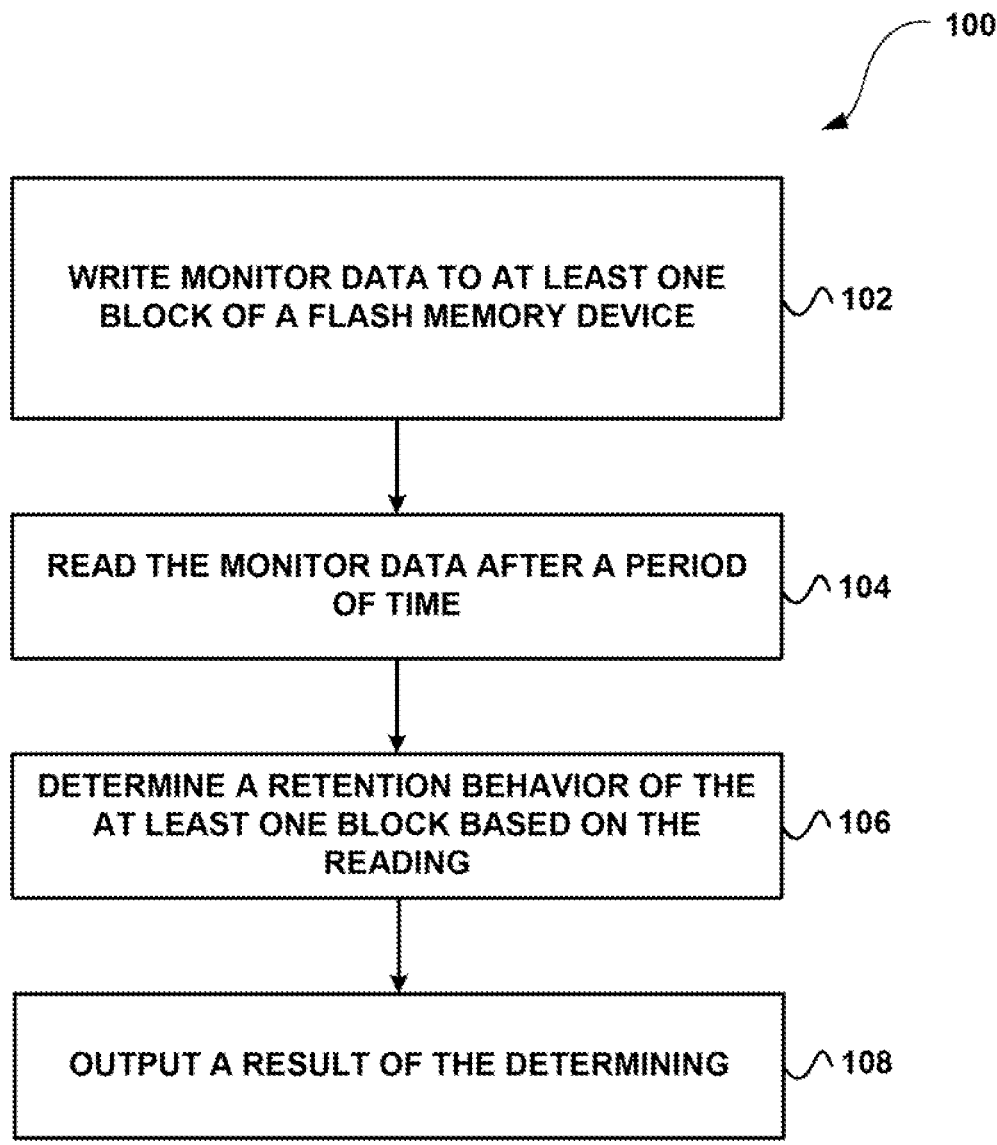
FIG. 1 illustrates a method for determining a retention behavior for at least one block of a flash memory device, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

In one general embodiment, a method is provided. In operation, monitor data information is gathered from a memory device having finite endurance and/or retention, the monitor data being data of known content stored in dedicated memory cells of known write cycle count. Additionally, the monitor data information is analyzed. Furthermore, a reliable life of the memory device or portion thereof is estimated based on the analysis. In addition, a rate of change of at least a highest cycle count of user data is tracked. Moreover, it is estimated when the reliable life of the memory device or portion thereof will be expended based on the tracking and the estimating. Still, yet, an action is taken prior to the reliable life of the memory device or portion thereof being expended.

In another general embodiment, a computer program product is provided including a computer usable medium having computer usable program code embodied therewith. The computer usable program code comprises computer usable program code configured to gather monitor data information from a memory device having finite endurance and/or retention, die monitor data being data of known content stored in dedicated memory cells of known write cycle count; computer usable program code configured to analyze the monitor data information; computer usable program code configured to estimate a reliable life of the memory device or portion thereof based on the analysis; computer usable program code configured to track a rate of change of at least a highest cycle count of user data; computer usable program code configured to estimate when the reliable life of the memory device or portion thereof will be expended based on the tracking and the estimating; and computer usable program code configured to take an action prior to the reliable life of the memory device or portion thereof being expended.

In another general embodiment, a system is provided, the system including a plurality of memory devices having finite endurance and/or retention, each of the memory devices having a plurality of memory blocks, at least one of the blocks having monitor data written therein, wherein the at least one block has been written to a plurality of times prior to writing the monitor data; and circuitry for addressing the blocks. The system further includes a processor in communication with the memory devices; a clock, the processor being in communication with the clock; and a computer usable medium, the computer usable medium having computer usable program code embodied therewith, which when executed by a processor causes the processor to: gather monitor data information from a memory device, the monitor data being data of known content stored in dedicated memory cells of known write cycle count; analyze the monitor data information; estimate a reliable life of the memory device or portion thereof based on the analysis; track a rate of change of at least a highest cycle count of user data; estimate when the reliable life of the memory device or portion thereof will, be expended based on the tracking and the estimating; and take an action prior to the reliable life of the memory device or portion thereof being expended.

In another general embodiment, a system is provided including logic for gathering monitor data information from a memory device having finite endurance and/or retention, the monitor data being data of known content stored in dedicated memory cells of known write cycle count; logic for analyzing the monitor data information; logic for estimating a reliable life of the memory device or portion thereof based on the analysis; logic for tracking a rate of change of at least a highest cycle count of user data: logic for estimating when the reliable life of the memory device or portion thereof will be expended based on the tracking and the estimating; and logic for taking an action prior to the reliable life of the memory device or portion thereof being expended.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without any combination of the other features described.

The methodology and systems described herein may be implemented in conjunction with, or include, any type of memory device having finite endurance and/or retention. Illustrative types of memory devices having finite write/erase endurance or limited data retention include devices comprising flash memory, phase change memory, ferroelectric memory, etc.

For ease of understanding and to place the teachings presented herein in a context, much of the present description is set forth in terms of a flash device, it being understood that this is done by way of example only and is not to be construed as limiting. Accordingly, the teachings herein may be applied to any NAND flash devices possess both finite write/erase endurance and limited data, retention. Current techniques for detecting wearout and retention have escape rates that are insufficient for information technology (IT) and some consumer applications. The consequences of an escape may be severe. For example, data may be corrupted due to an escape.

The error rate in flash is a 3-D surface, as it depends both on the write cycle count and the age of the data. See, e.g., FIG. 2 and discussion thereof, below. Since cells can be driven to complete failure, the error rate can exceed the detection power of any sector-level error correcting code (ECC). This can result in corrupt data being passed as valid on a subsequent read operation.

In some cases, NAND storage devices may implement some form of wear leveling to increase the time before the first wearout event. A side effect of such an approach is to further enhance wearout clustering, as many blocks may approach wearout at the same time. Using the sector ECC to monitor the bit error rate may suffer from an aliasing effect and the ability to detect the onset of wearout may be limited.

Some other techniques for detecting wearout are similarly lacking in accuracy. These include testing for successful erase and successful programming. These techniques cannot detect the situation where the data retention time is longer than an operation verify time of ~100 nS, but significantly shorter than the stated endurance of $3\times10^{17}$ nS (~10 years), which is a spread of 15 orders of magnitude. At least some embodiments provided herein address these and other limitations by providing techniques for determining a retention behavior of a flash memory device.

FIG. 1 illustrates a method 100 for determining a retention behavior for at least one block of a flash memory device, in accordance with one embodiment. As shown, monitor data is written to at least one block of a flash memory device. See operation 102.

The flash memory device may include any flash memory device including blocks of memory. For example, in one embodiment, the flash memory device may be a NAND device.

In the context of the present description, the data patterns used by the monitor data may refer to any data or data pattern that is known. For example, in one embodiment, the monitor data may include data patterns whose entire value is known to a memory system, a system including the memory, or another host system, hi this case, errors may be characterized according to number, location, and pattern.

Additionally, in one embodiment, the monitor data may be generated. In this case, the monitor data may not be passed on as user data, but may be generated internally by a host system. The monitor data may be written to physical blocks, bypassing any wear leveling. In this way, the monitor data may not be subject to wear leveling.

Furthermore, multiple blocks of the flash memory device may be selected for storing the monitor data, where at least two of the blocks are not physically adjacent each other, e.g., to provide sampling of behaviors of different regions of the device. In any case, the monitor data may be written to multiple groups of blocks, where a number of write cycles performed for each group is different.

It should be noted that the at least one block may have been written to a plurality of times prior to writing the monitor data. For example, the same data may be rewritten consecutively, different data may be written on each, rewrite, a combination of the two, etc. Thus, the monitor data that is ultimately stored on the device may not necessarily be the monitor data that was used during each cycle of writing.

After a period of time, the monitor data is read. See operation 104. The period of time may include any length of time after a point where the monitor data is written (e.g. seconds, minutes, hours, clays, etc.). In one embodiment, this period of time may include a user or system defined period of time. As an option, the period of time may be configurable, in any approach, an output of a run time clock, real time clock, calendar, etc. may be used to measure the data age, periods of time, etc. Use of a real time clock is advantageous in that the data age may be readily determined in spite of periods of being powered off power loss, etc.

Once the monitor data is read, a retention behavior of the at least one block is determined based on the reading. See operation 106. In the case that the monitor data is known to the host, system, the determining of the retention behavior may include comparing the read monitor data to a stored version thereof.

Furthermore, the reading of the monitor data and the determining of the retention behavior of the at least one block may occur at periodic intervals. In this case, the periodic intervals may include intervals defined by a user or defined automatically by a system.

Once the retention behavior is determined, a result of the determining is output. See operation 108. In one embodiment, an operational limit of the flash memory device, or portion thereof, may be determined based on the result of the determining of the retention behavior of the at least one block. As an option, writes may no longer be allowed to the flash memory device or a portion thereof when the operation limit is met.

Preferably, the monitor data is write protected by any manner known in the art, e.g., by omitting it from a mapping of available data space. It should be noted that, in one embodiment, at least a portion of the at least one block having the monitor data may be write protected. For example, at least a portion of the at least one block having the monitor data may be write protected to prevent being overwritten with user data.

In one approach, the write protection may be accomplished by marking the blocks as unwritable in a memory controller. In another approach, an indication of a protected block, or portion thereof may be stored on the flash memory device. Furthermore, in one embodiment, the monitor data may include less than about 1% of a memory capacity of the flash memory device, and more preferably less than about 0.5%. In other embodiments, less than 0.1% of the memory capacity may be used for storing the monitor data.

Using the method 100, flash wearout and retention may be measured by the addition of monitor data to the flash memory device. The monitor data may include data patterns where all values are known to a host system. Thus, errors may be characterized according to number, location, and pattern.

A set of blocks may be positioned at high cycle counts, prior to any user data achieving these cycle counts, A sample of the error rate surface may be made using this data. Once positioned at high cycle count, the monitor data may be checked at intervals to measure the retention behavior. As an option, the measured wearout and data retention limits may be reported via self-monitoring, analysis, and reporting technology (S.M.A.R.T.).

As noted above, NAND flash devices may suffer from finite endurance for erase/write cycles and finite data retention. This is a consequence of the poor reversibility of the data storage process, which drives charge through an insulator. As a result, the bit error rate in flash may be characterized as a 3-D surface.

Figure 2:
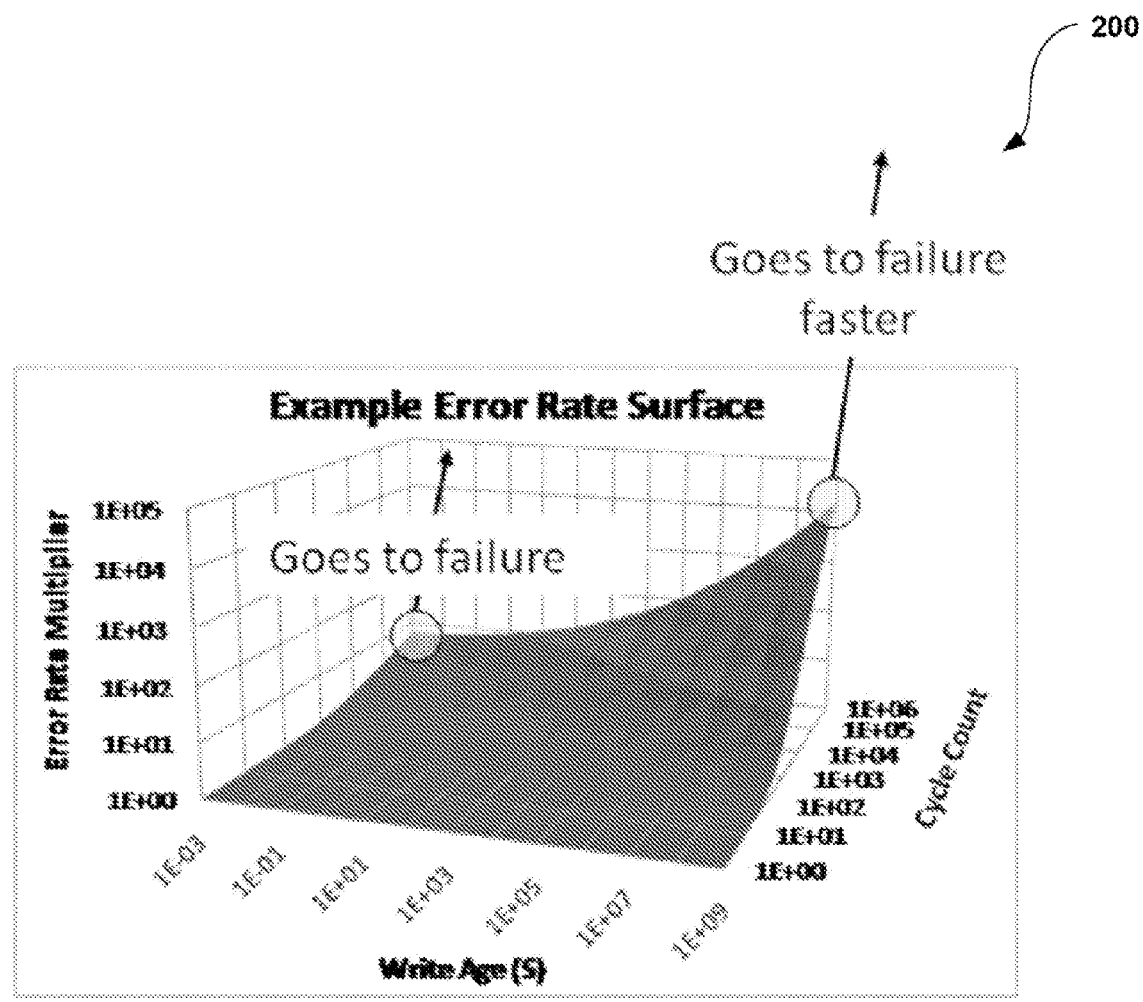
FIG. 2 illustrates a representative plot showing a shape of a flash error rate surface, in accordance with one embodiment.

FIG. 2 illustrates a representative plot 200 showing a shape of a flash error rate surface, in accordance with one embodiment. As shown, the X-axis shows the data age in seconds, from 1 millisecond to 10 years. The depth axis shows the write cycle count, from 1 to $1\times10^6$ ft cycles. The vertical axis is the error rate multiplier. The error rate surface of most flash devices has the general characteristics as shown in FIG. 2.

If cells are written to a sufficiently high cycle count, they fail completely (e.g. an error rate of ½). Thus, the error rate at the left rear corner of the surface illustrated in FIG. 2 increases to failure at some cycle count. Further, the failure occurs at lower cycle counts when the age of the data increases. Thus, the error rate at the right rear corner goes to failure even faster. Designing an ECC, or ECC plus a cyclic redundancy check (CRC) depends on knowing the error rate or the shape of the surface.

Many NAND devices have a number of issues that may impact data integrity. These may include charge detrapping, stress-induced leakage current (SILC), read disturb and write disturb, and/or other issues.

The manufacturing tests for flash (e.g. JEDEC, JESD47F, etc) are inadequate for IT data integrity. The SILC test uses only 38 devices per lot for 500 hours. Zero errors in such a test indicate an escape rate as high as 6%, to 90% confidence. Further, a 500 hour test allows testing a maximum of 10% of the device to the endurance limit (assuming the rest of the device is not tested at all), but at a data age of only 100 nS.

The data integrity requirements for IT systems may be very strict. Returning corrupt data is generally not acceptable, A loose target of one event per 10 M unit-years may be set. At a 10 kIOPS rate, this gives an uncorrected error rate of $1\times10^{-23}$ per bit transferred for a typical 4 kB IO. Thus, designing IT flash systems using the stated endurance specifications may entail significant risk.

Wear leveling may be utilized to increase the time until there are no free blocks below the endurance cycle count. Free blocks may be achieved through spares, or even by moving the static data, for example. One goal of a static wear leveling algorithm is to maximize the cycle count until there are no free or freeable blocks below the endurance limit.

An ideal static wear level algorithm would produce the narrowest distribution at any point in time. This would give the maximum total cycle count for the device. In this case, however, wear leveling assumes the existence of a robust technique for determining that a block has worn out. That is, wear leveling assumes that a cumulative distribution function (CDF) for wearout has an onset that is sudden, and at a known cycle count. Additionally, it is assumed that all blocks have the same wearout characteristics. Further, the effects of retention are ignored.

Figure 3:
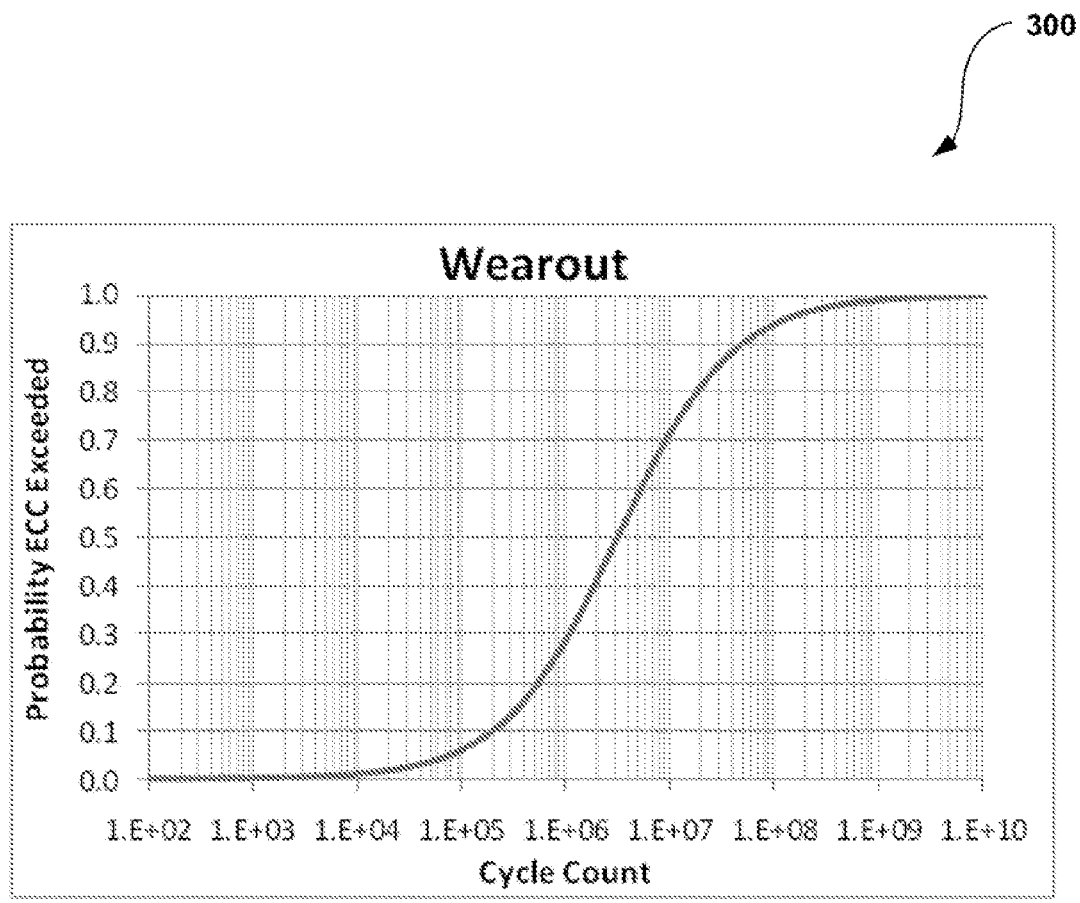
FIG. 3 shows an exemplary cumulative distribution function (CDF) illustrating the probability that a given block will exceed the correction power of a sector-level error correcting code (ECC) due to wearout at some data age, in accordance with one embodiment.

FIG. 3 shows an exemplary CDF 300 illustrating the probability that a given block wilt exceed the correction power of a sector-level ECC due to wearout at some data age, in accordance with one embodiment. Sector level ECC may be utilized in flash to protect against soft errors and other effects. However, there is a finite limit to the power of the ECC, and this may be exceeded at some point due to block wearout. When this happens, corrupt data may be returned. Additional sector checks, such as a CRC, move the point at which this happens, but may not eliminate this issue.

The curve in FIG. 3 is representative of what the actual field behavior may be at a short data age, in accordance with one embodiment. Assuming a device with an endurance specification of $10^5$ cycles, this may be assigned to a 6% probability, given the JEDEC test results. In this example, it was assumed that 94% of the blocks fall at $10^8$ cycles. At longer data ages, the curve would to shift to the left.

Figure 4:
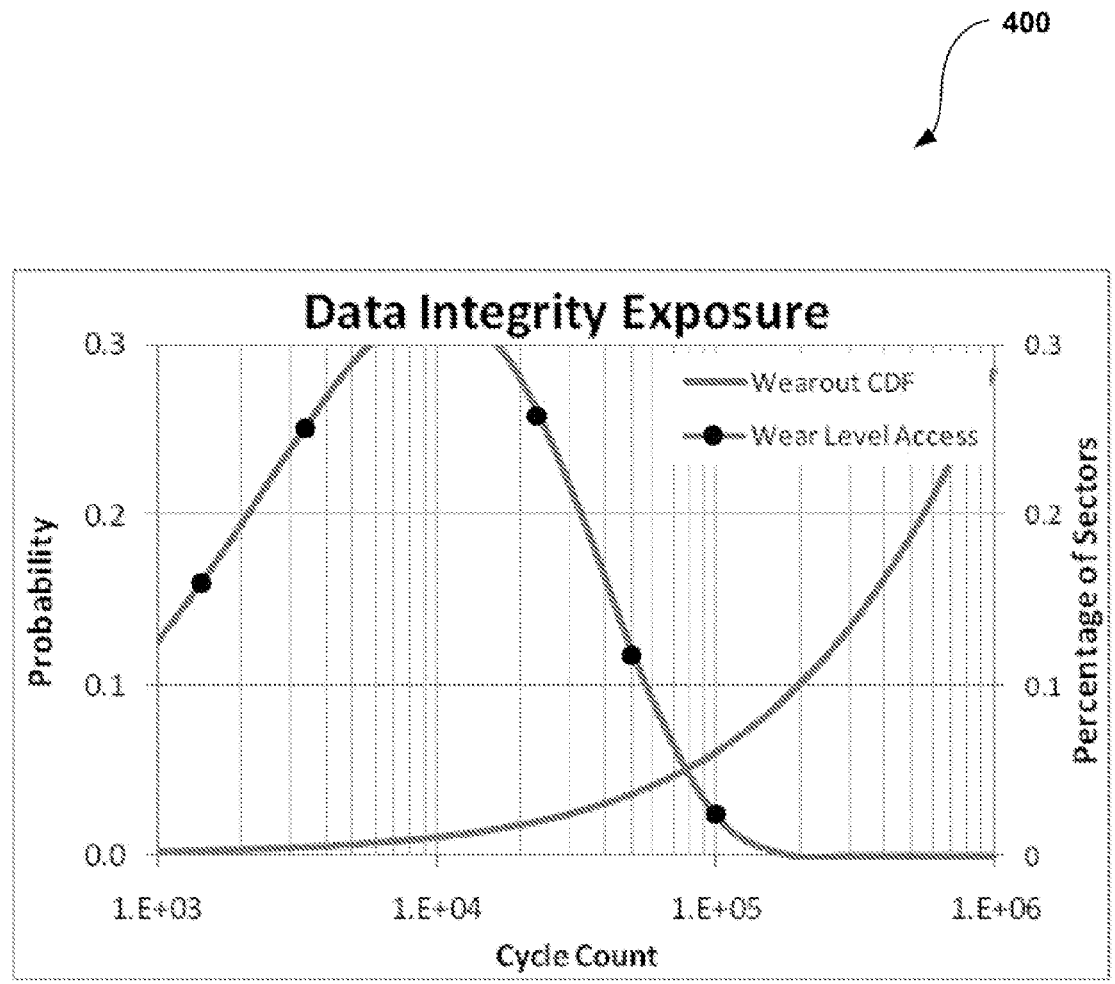
FIG. 4 illustrates a representation of the overlap between the access distribution and the CDF at some data age, in accordance with one embodiment.

The reliability impact may be seen in FIG. 4. FIG. 4 illustrates a representation 400 of the overlap between the access distribution and the CDF at some data age, showing the region of concern, in accordance with one embodiment.

Using FIG. 4, the overlap between the access distribution and the CDF may be seen. The narrower the access distribution, the more likely a large percentage of blocks are in the wearout zone before the wearout is noticed. Thus, it is more likely that a power of the sector ECC will be exceeded and corrupt data will be returned.

To address these and other issues, the error rate surface may be sampled to aid in the determination of the endurance and retention limits for a flash device. In one embodiment, this may be achieved by reserving a number of physical blocks that are not subject to wear leveling. These blocks may include data that is known, to a host system such that the values may be fully verified, avoiding any aliasing problems inherent in using error rates determined from ECC.

Further, such blocks may be used at an error rate beyond the ECC capabilities without compromising data integrity. The monitor data may also be verified at intervals to measure the error rate versus retention.

In one embodiment, a set of full erase blocks that are positioned near the expected rise of the CDF may be utilized to aid in determining expected wearout before it leads to data corruption. For example, a flash device may have 16,000 erase blocks. Using 15 blocks as monitor data would take less than 0.1% of the device capacity.

As an option, 15 blocks arranged in 5 groups of 3 may be utilized. Each group may have the same cycle count. In this case, having multiple blocks in a group may improve the quality of the measurement. The locations (in terms of cycle count) for each group may be chosen to be near the region where the CDF is expected to begin to have a magnitude that may impact data integrity.

As an example, Table 1 shows characteristics representative of flash device, in accordance with one embodiment.

TABLE 1

| Capacity | 8 GB | Page Write | 800 us |
|---|---|---|---|
| Page | 4 kB | Block Erase | 1500 us |
| Erase bloc k | 128 pages | Page Read | 60 us |
| Blocks | 16,384 | Block Read | 21 ms |
| Endurance | $10^5$ | Block Write | 116 ms |

In this example, the time to erase/write/read a block is 138 mS. Thus, a monitor data target layout of 5 monitor groups may be chosen. Table 2 shows a representation of a monitor data target layout of 5 monitor groups, in accordance with one embodiment.

TABLE 2

| Target Cycles (K) | 20 | 36 | 63 | 112 | 200 | Total |
|---|---|---|---|---|---|---|
| Time to Deploy (H) | 2.3 | 4.1 | 7.3 | 12.9 | 23.0 | 50 |

In this case, the cycle counts are chosen to be power-law distributed assuming that wearout has a log-normal behavior. In various embodiments, other distributions may be chosen to maximize the effectiveness of the monitor data. In this example, it would take a total of 50 hours to cycle all the monitor data to the final counts.

Figure 5:
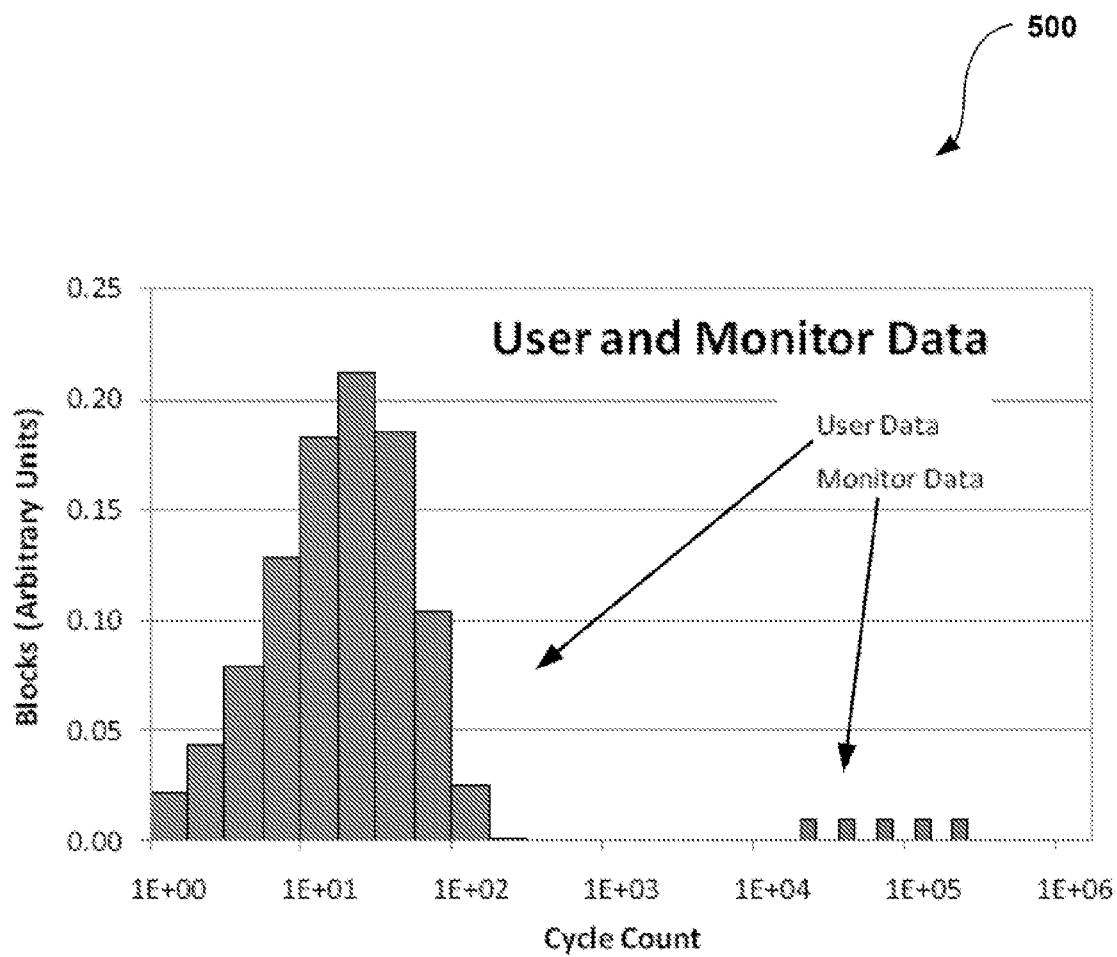
FIG. 5 shows representative cycle count histograms for a user and monitor data at some point in time, in accordance with one embodiment.

FIG. 5 shows representative cycle count histograms 500 for a user and monitor data at some point in time, in accordance with one embodiment. In this case, the histograms of user data and monitor data are shown as function of write cycle count. Furthermore, the data includes wear leveling.

As shown, the monitor data is positioned near the anticipated wearout cycle count. In some cases, the time required to cycle all the monitor data blocks may be longer than desirable to perform prior to shipment, in such a case, the monitor data may be partially cycled prior to shipment, with the remainder of the cycling occurring in the field.

Once the monitor data is at the final cycle count, the blocks may be read at intervals and the read data may be compared with the known data. This allows complete identification of errors, including the ability to maintain a rate of change.

Figure 6:
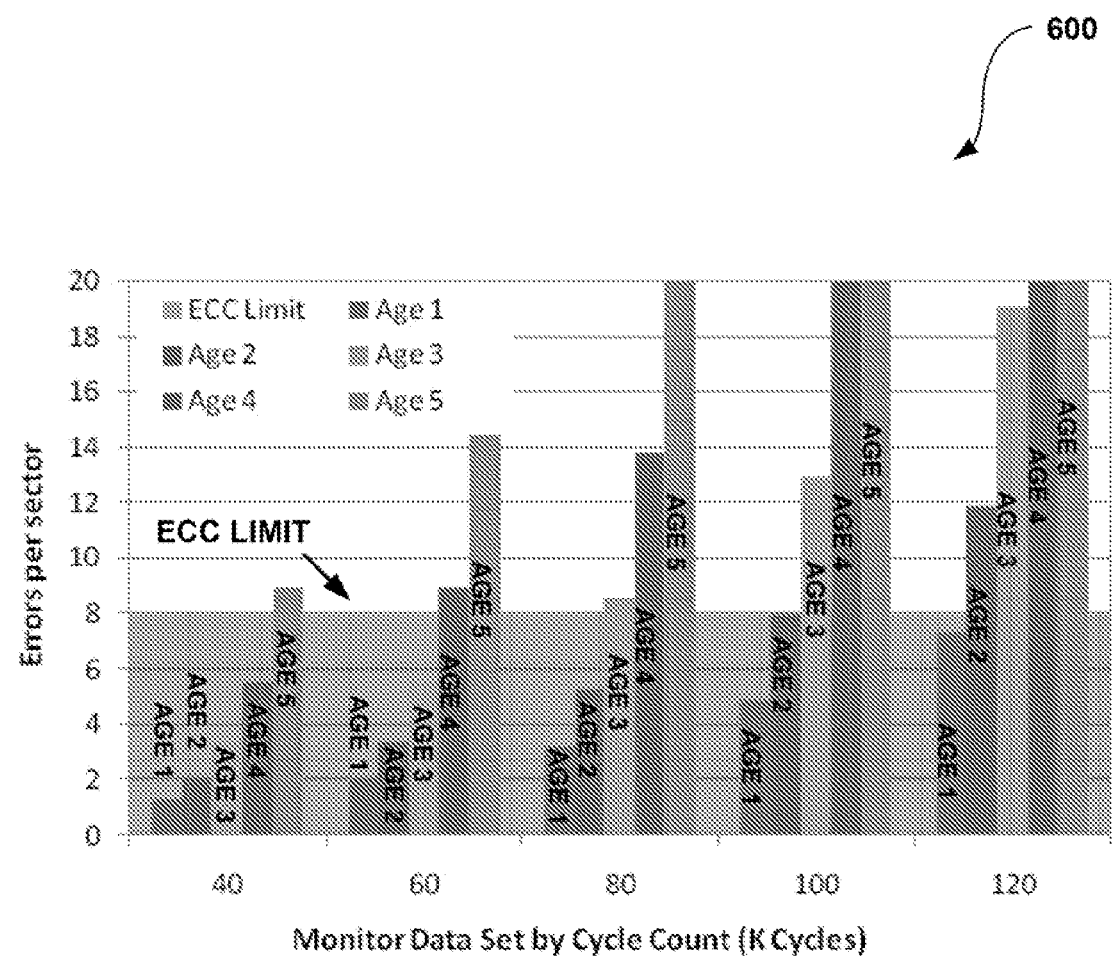
FIG. 6 shows one possible set of measurements from a monitor data system.

FIG. 6 shows one possible set of measurements 600 from a monitor data system. Each monitor group is shown as a column group and each in the group represents a different data age. The height, of each column is the number of errors per sector and the lower region labeled "ECC Limit" represents a possible ECC correction limit. As shown, some measurements may exceed the ECC capability and thus pose a risk for data integrity.

In one embodiment, operational limits may be derived from this data. For example. Table 3 shows operational limits that may be generated for the exemplary data in FIG. 6, in accordance with one embodiment.

TABLE 3

| Minimum Cycle Count | Maximum Cycle Count | Maximum Data Age |
|---|---|---|
| <40 k | | 4 |
| 40 k | 60 k | 3 |
| 60 k | 80 k | 2 |
| 80 k | 100 k | 2 |
| 100 k | 120 k | 1 |
| >120 k | | Not allowed |

A monitoring data pattern may also be chosen, in various embodiments, this may be a static pattern or be computed for a particular block. As an option, a pattern that stresses the endurance and/or retention may be utilized. In either case, a system may be configured such that the expected contents of each monitor block may be known without reading anything from the flash device. When one of the limits is reached, the system may be informed by a S.M.A.R.T. flag, or another technique such as no longer accepting writes (e.g. returning error on write, etc.).

While much of the above description has described the monitor data units as including entire flash blocks, the techniques discussed are not limited to using entire flash blocks. For example, in one embodiment, the monitor data units may be as small as a sector size.

Although, using sector size monitor data units will retain the monitoring characteristics, in some cases, this may leave exposure to hard errors. For example, if a page size monitor is utilized with user data in the rest of the block, the user data may be marked as lost (i.e. a hard error) if the monitor page exhibited an error rate close to the ECC limits. This is because the sector ECC may not be reliable in such situations. Using this technique, however, the probability of corruption events would still be reduced at a lower overhead.

Figure 7:
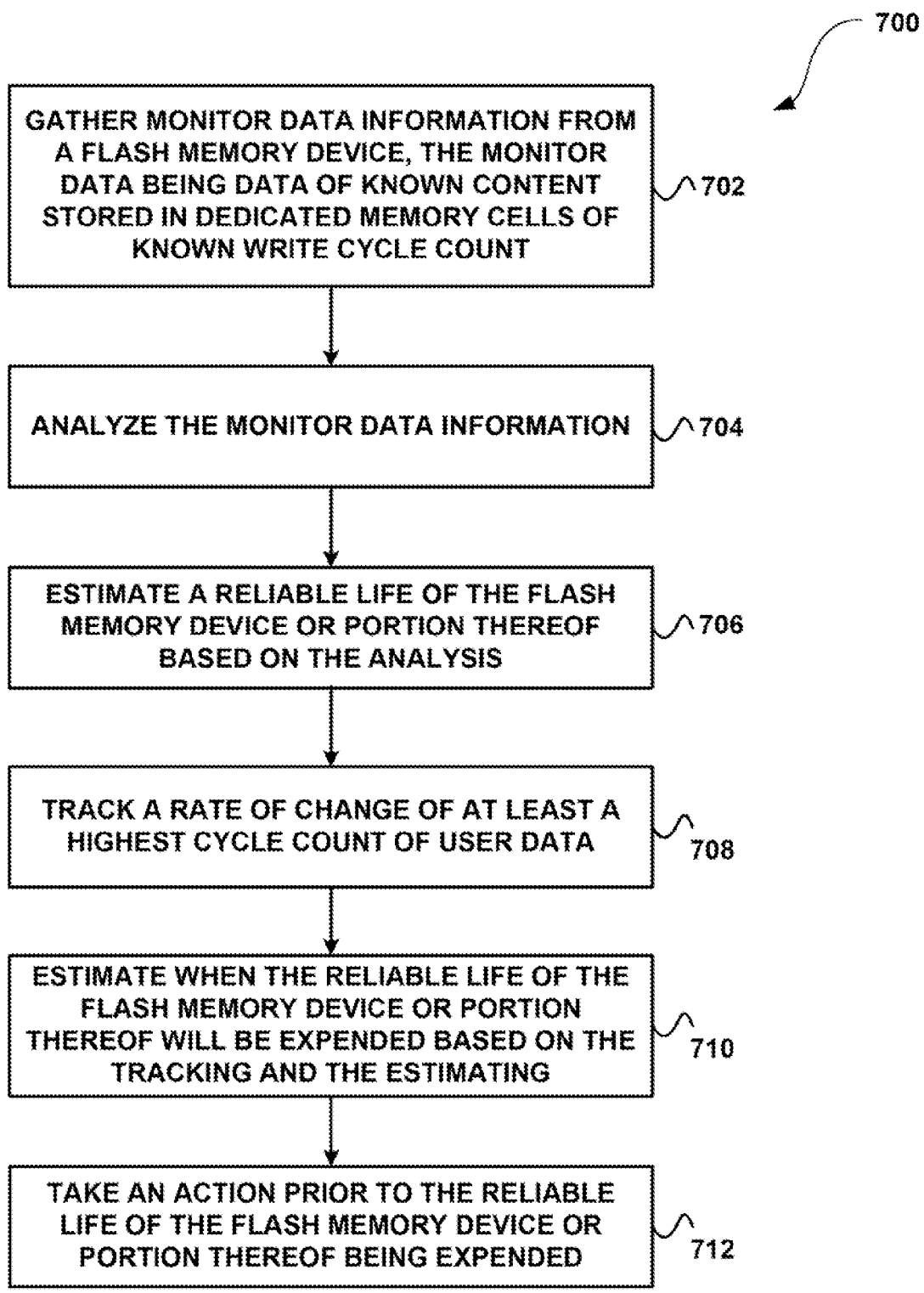
FIG. 7 illustrates a method for estimating when a reliable life of a flash memory device, or portion thereof will be expended, in accordance with one embodiment.

FIG. 7 illustrates a method 700 for estimating when a reliable life of a flash memory device, or portion thereof will be expended, in accordance with one embodiment. As shown, monitor data information is gathered from a flash memory device, the monitor data being data of known content stored in dedicated memory cells of known write cycle count. See operation 702.

The monitor data may include any data or data pattern that is known. In one embodiment, the monitor data information may include error rate information relating to at least one of the data age of the monitor data and the write cycle count. Furthermore, monitor data and/or the monitor data information may be gathered using a variety of techniques. In one embodiment, the monitor data may be generated.

Once the monitor data information is gathered, the monitor data information is analyzed. See operation 704. A reliable life of the flash memory device or portion thereof is then estimated based on the analysis. See operation 706. Furthermore, a rate of change of at least a highest cycle count of user data is tracked. See operation 708.

In one embodiment, tracking the rate of change of the highest, cycle count of user data may include generating a time-dependent histogram that incorporates the cycle count and an approximate or actual age of the user data. As an option, an age of the user data may be determined based on an output of a real time clock. As another option, an age of the user data may be determined based on a time stamp for an erase block.

Additionally, it is then estimated when the reliable life of the flash memory device or portion thereof will be expended based on the tracking and the estimating. See operation 710. In one approach, the reliable life of the flash memory device or portion thereof (e.g., certain blocks or sections) may be expended when the capability of the error correction code used to accurately correct errors has been exceeded. This can be estimated using the monitor data, as discussed above. Other measures of the reliable life can also be used.

Once it is estimated when the reliable life of the flash memory device or portion thereof will be expended, an action is taken prior to the reliable life of the flash memory device or portion thereof being expended. See operation 712. The action may include a variety of actions.

For example, in one embodiment, taking the action may include outputting an alert indicating a need for maintenance (e.g., a repair, etc.). In this case, the alert may be output prior to the estimated time (W) when the reliable life of the flash memory device or portion thereof will be expended minus an estimated time (R) for performing the maintenance, or time to repair.

In another embodiment, taking the action may include disabling writes to the flash memory device or portion thereof. In this ease, the writes may be disabled prior to the estimated time (W) when the reliable life of the flash memory device or portion thereof will be expended minus an estimated time (R) for performing the maintenance, or time to repair.

In yet another embodiment, taking the action may include moving data from the flash memory device or portion thereof to another flash memory device. In this case, the data may be moved prior to the estimated time (W) when the reliable life of the flash memory device or portion thereof will be expended minus an estimated time (R) for performing the maintenance, or time to repair.

In still another embodiment, taking the action may include rearranging the user data on the flash memory device to extend the reliable life of the flash memory device or portion thereof. In this case, the user data may be rearranged on the flash memory device prior to the estimated time (W) when the reliable life of the flash memory device or portion thereof will be expended minus an estimated time (R) for performing the maintenance, or time to repair. As another option, taking the action may include limiting a write data rate to the flash memory device or portion thereof.

Using this technique, a system and method may be implemented for predicting the time when it is no longer safe to use a flash device due to data integrity concerns. This will allow for a scheduled maintenance event to replace such a device in a flash based storage system, reducing costs and improving customer satisfaction. In one embodiment, the flash device may report this prediction via S.M.A.R.T. As an option, the prediction may be based on an internal measurement of the wearout and retention characteristics of the given flash device, as well as the usage patterns for the device.

In existing flash devices, such predictions may only be based on a simple cycle count limit, which can result in both substantial overkill and escape events. Overkill events increase costs, and escape events result in data corruption. Thus, the method 700 may be utilized to more accurately predict the time when a flash device should no longer be used.

Figure 8:
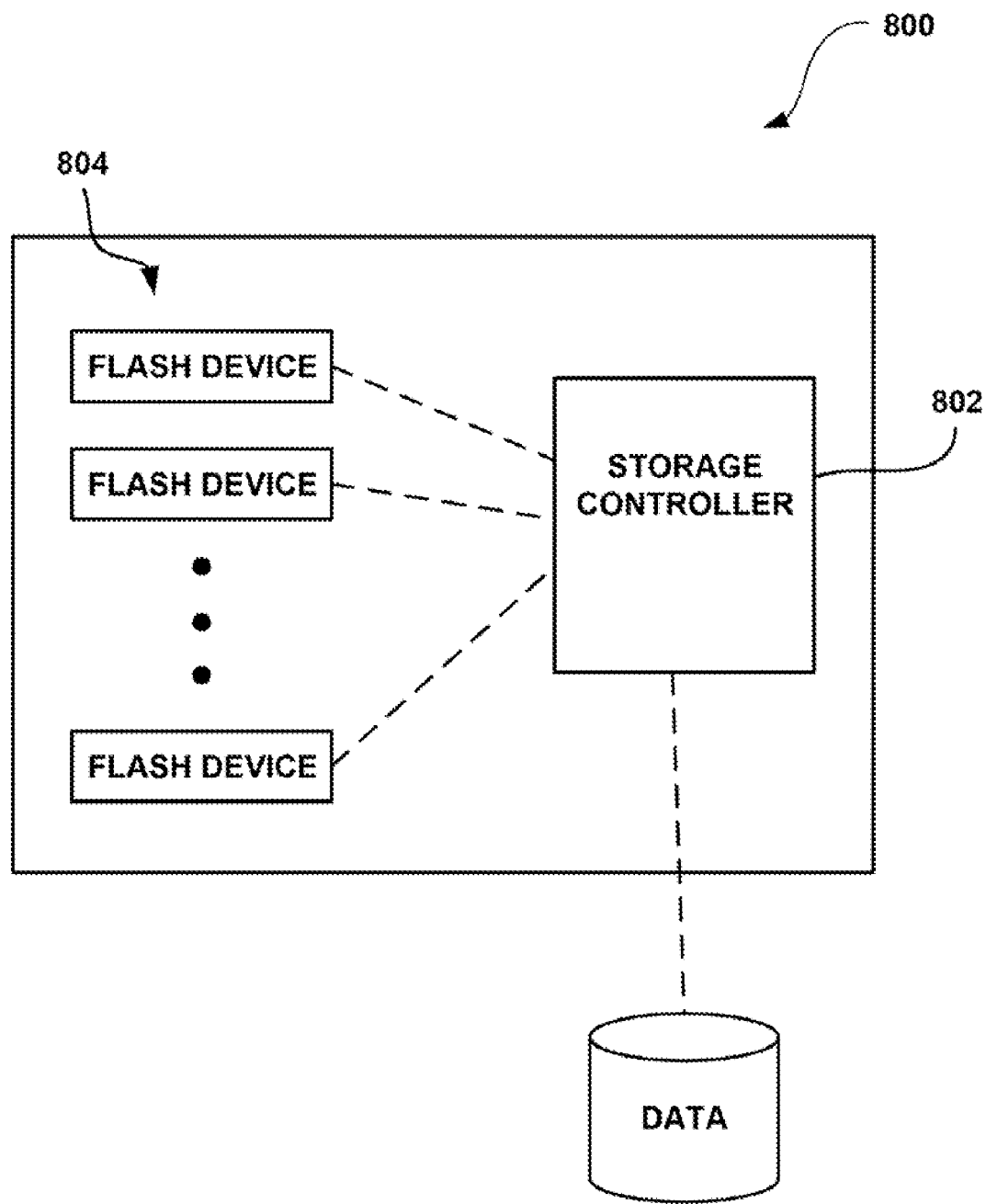
FIG. 8 illustrates a representative storage system, in accordance with one embodiment.

FIG. 8 illustrates a representative storage system 800, in accordance with one embodiment. As shown, the storage system 800 may include a storage controller 802 and a plurality of flash devices 804.

In one embodiment, the storage controller 802 may include, or have access to, a real-time clock. This clock may be used to record the write times of the monitor data (either in the monitor data or in another reserved area) and to determine the age of the monitor data.

As noted above, the monitor data approach may be utilized to provide a measurement of the error rate surface in a flash device. Furthermore, a measure of the error rate vs. cycle count and error rate vs. data age may be provided.

In one embodiment, a data access histogram may be generated and the time dependent changes of the histogram may be measured to project the time at which the flash device should be replaced. In another embodiment, the system may track the rate of change of the highest cycle of the user data. Furthermore, a time-dependent histogram may be generated and logged which incorporates both the data age and the cycle count, and how these change over time. This will allow for detection of limits in both cycle count and data age.

In one embodiment, tracking the data age may be facilitated by the use of a real-time clock, typically provided by a host system. In another embodiment, the age of data may be estimated by keeping a single time stamp for each erase block, which can track the time of the erase or of the first write time following the erase. The former time stamp may then be an upper bound on the data age, while the later time stamp will indicate the age of the oldest data.

As an option, an ISO standard 64-bit absolute time may be utilized, as this will facilitate tracking the IO rate as well. In the case that space efficiency is a concern, the precision does not need to be very high for tracking the data age. If die data retention becomes as short as hours, then the device may no longer be suitable for data storage. Similarly, there may be no need for the age to be kept beyond the advertised lifetime (e.g. 10 years, etc.).

Thus, a time resolution may be chosen based on the characteristics of the system, and/or the desires of a user. For example, a time resolution of 2 hours may be chosen. In this case, a 16-bit time stamp may be able to time up to 15 years, which should be sufficient, to avoid wrapping. Alternatively, a first timestamp may be kept to be used as a relative offset.

As an option, the timestamp may be stored as metadata for each erase block. For example, this may be stored in the erase block. A typical 4 GB flash device has an erase block size of 512 kB. Reserving a 512 B sector in the block for metadata is only a 0.1% capacity impact. Reserving an entire 4 kB page would cost 0.8% (e.g. for devices that do not allow partial page writes). As another option, the time stamp may be stored in a separate metadata area, such as with wear leveling information.

Figure 9A:
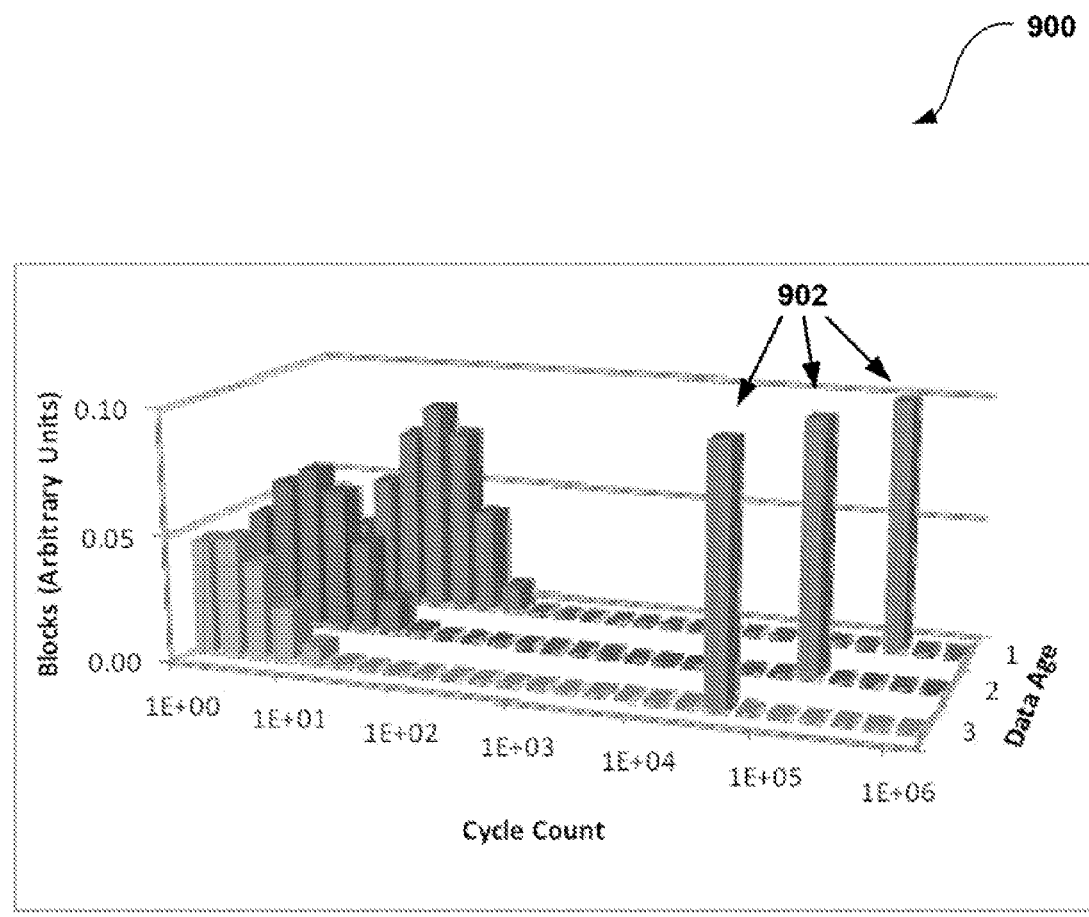
FIG. 9A shows a histogram illustrating block count vs. cycle count and data age at a first time, in accordance with one embodiment.

FIG. 9A shows a histogram 900 illustrating block count vs. cycle count and data age at a first time, in accordance with one embodiment. In this case, the bars 902 at each data age indicate the cycle count limit for that data age.

As shown, the data age is binned at three different values. This histogram 900 collapses to the simple 1D cycle count case if the system does not track the data age. Also shown are the computed cycle count limits for each data age, such as reported by the monitor data approach, discussed above.

Figure 9B:
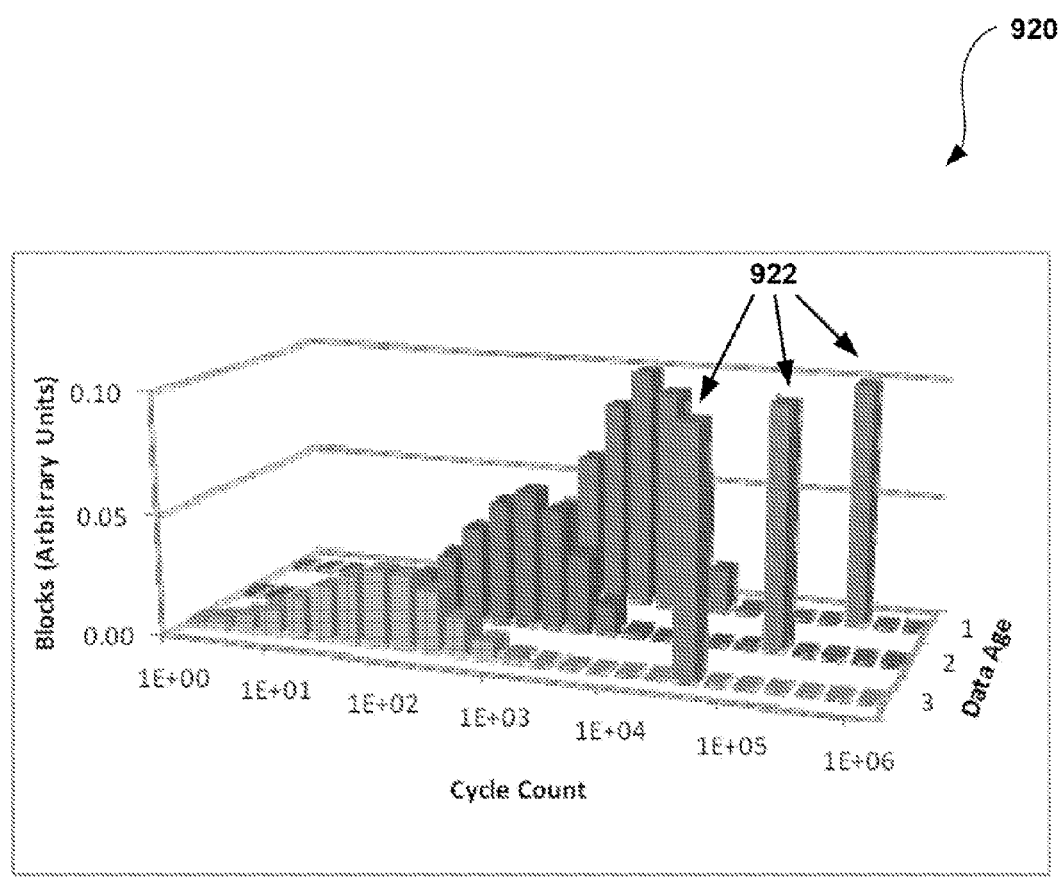
FIG. 9B shows a histogram illustrating block count vs. cycle count and data age at a second time later than the first time, in accordance with one embodiment.

FIG. 9B shows a histogram 920 illustrating block count vs. cycle count and data age at a second time later than the first time, in accordance with one embodiment. In this case, the bars 922 at each data age indicate the cycle count limit for that data age. As shown in FIG. 9B, the histogram changes with time, as data writes and wear leveling have occurred.

In operation, at a first predetermined time t1, a system may store the maximum cycle count, C[t1,i], in each age bin i. At a second predetermined time t2, the maximum cycle counts C[t2,i] may again be determined. This allows the system to compute a rate of change of cycle count with time for each age V[t2,i] as shown in Equation 1.

$$V[t2, i] = \frac{C[t2, i] - C[t1, i]}{t2 - t1} \qquad \text{Equation 1}$$

This may be combined with the maximum cycle count M[i], for each age bin i to produce the estimated time W until one of the maximum cycle counts is reached, as shown in Equation 2 (for all i).

$$W = \min\left(\frac{M[i] - C[t2, i]}{V[t2, i]}\right) \qquad \text{Equation 2}$$

Assuming that the mean time to repair R is known (or estimated), the system may indicate the need for scheduled maintenance prior to time W-R. As shown, a single time interval measurement may be used to compute the time W. In various other embodiments, more sophisticated measurements may be performed, including averaging, curve fitting, using a control loop like predictor, or various other techniques.

Further, if the time W-R approaches, and maintenance still has not occurred, the system may take preventative action while awaiting maintenance, in various embodiments, such action may include preemptively failing the unit question after moving the data to some hot spare space (e.g. which may be distributed over a plurality of other units, etc.), limiting the write data rate (e.g. to extend the time, etc), failing the unit for new write data (e.g. keeping the existing data, but re-vectoring new writes to other space or flagging invalid data), and/or preemptively moving only data at retention risk to spare space.

In one embodiment, the system may compute W-R at time intervals as the cycle count histogram changes. For periodic assessment, the interval may be of the order of the repair time, R. The result is that the system may now predict the time at which maintenance should be scheduled well in advance of the time when it is actually needed. This can significantly reduce maintenance costs.

It should be noted that the invention can take the form of an entirely hardware embodiment, an entirely software embodiment or an embodiment containing both hardware and software elements. For example, in one embodiment, a system may include a flash memory device having a plurality of memory blocks, where at least one of the blocks has monitor data written therein, and the at least one block has been written to a plurality of times prior to writing the monitor data. The system may also include circuitry for addressing the blocks and a secondary memory storing a copy of the monitor data. Additionally, the system may include a storage controller and a plurality of flash memory devices.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical, fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (FAN) or a wide area network (WAN), or the connection may be made to an external computer (for example, through the internet, using an Internet Service Provider).

The present invention is described herein with reference to flowchart, illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical functions). It should also be noted that, in some alternative implementations, the functions noted in the block may occur out of the order noted in the figures. For example, two blocks shown in succession may, in feet, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet, cards are just a few of the currently available types of network adapters.

Figure 10:
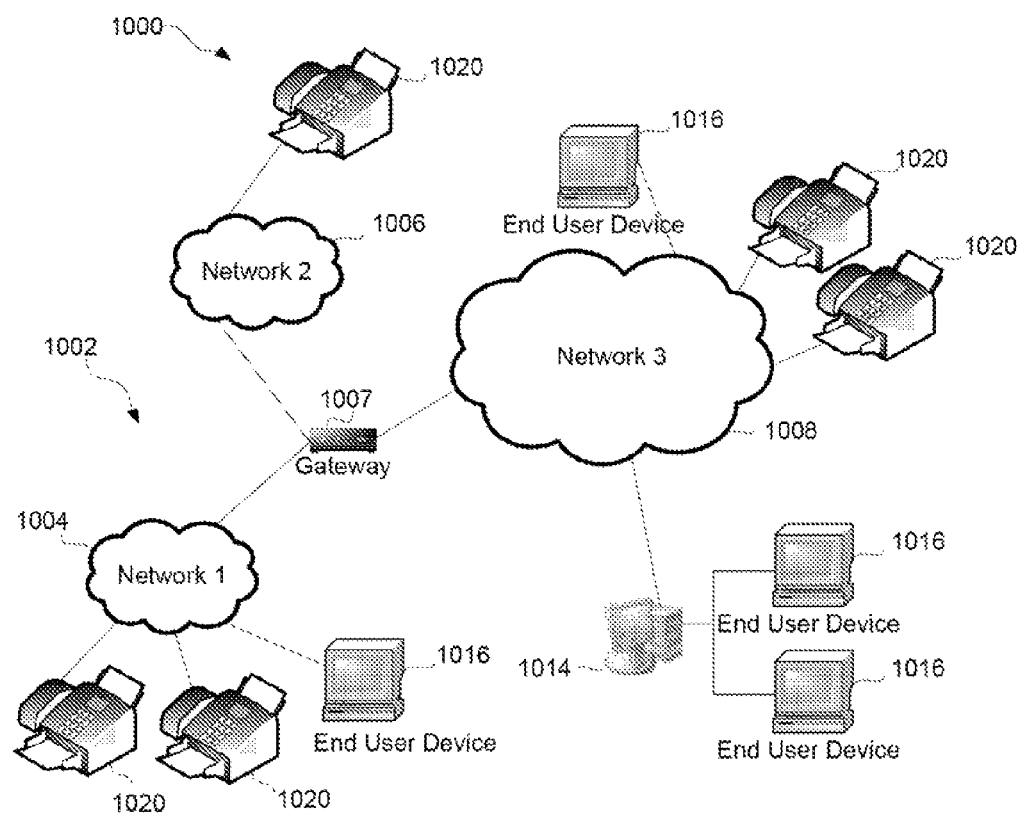
FIG. 10 illustrates a network architecture, in accordance with one embodiment.

FIG. 10 illustrates a network architecture 1000, in accordance with one embodiment. As an option, the functionality and architecture of FIGS. 1-9 may be implemented in the context of the network architecture 1000. However, the functionality and architecture of FIGS. 1-9 may be carried out in any desired environment. It should be noted that the aforementioned definitions may apply during the present description.

As shown in FIG. 10, a plurality of remote networks 1002 are provided including a first remote network 1004 and a second remote network 1006. A gateway 1007 may be coupled between the remote networks 1002 and a proximate network. 1008. In the context of the present network architecture 1000, the networks 1004, 1006 may each take any form including, but not limited to a LAN, a WAN such as the Internet, PSTN, internal telephone network, etc.

In use, the gateway 1007 serves as an entrance point from the remote networks 1002 to the proximate network 1008. As such, the gateway 1007 may function as a router, which is capable of directing a given packet of data that arrives at the gateway 1007, and a switch, which furnishes the actual path in and out of the gateway 1007 for a given packet.

Further included is at least one data server 1014 coupled to the proximate network 1008, and which is accessible from the remote networks 1002 via the gateway 1007. It should be noted that the data server(s) 1014 may include any type of computing device/groupware. Coupled to each data server 1014 is a plurality of user devices 1016. Such user devices 1016 may include a desktop computer, lap-top computer, hand-held computer, printer or any other type of logic. It should be noted that a user device 1016 may also be directly coupled to any of the networks, in one embodiment.

A facsimile machine 1020 or series of facsimile machines 1020 may be coupled to one or more of the networks 1004, 1006, 1008. It should be noted that databases and/or additional components may be utilized with, or integrated into, any type of network element coupled to the networks 1004, 1006, 1008. In the context of the present description, a network element may refer to any component of a network.

Figure 11:
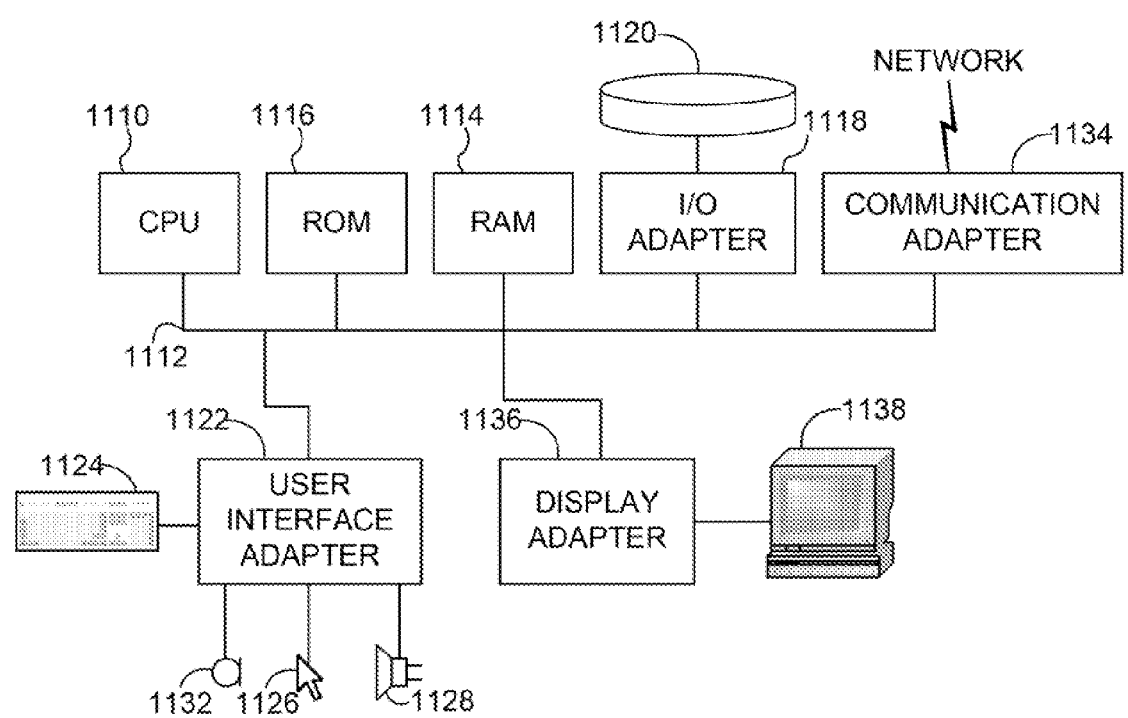
FIG. 11 shows a representative hardware environment that may be associated with the servers and/or clients of FIG. 10, in accordance with one embodiment.

FIG. 11 shows a representative hardware environment associated with a user device 1016 of FIG. 10, in accordance with one embodiment. Such figure illustrates a typical hardware configuration of a workstation having a central processing unit 1110, such as a microprocessor, and a number of other units interconnected via a system bus 1112.

The workstation shown in FIG. 11 includes a Random Access Memory (RAM) 1114, Read Only Memory (ROM) 1116, an I/O adapter 1118 for connecting peripheral devices such as disk storage units 1120 to the bus 1112, a user interface adapter 1122 for connecting a keyboard 1124, a mouse 1126, a speaker 1128, a microphone 1132, and/or other user interface devices such as a touch screen and a digital camera (not shown) to the bus 1112, communication adapter 1134 for connecting the workstation to a communication network 1135 (e.g., a data processing network) and a display adapter 1136 for connecting the bus 1112 to a display device 1138.

The workstation may have resident thereon an operating system such as the Microsoft Windows® Operating System (OS), a MAC OS, or UNIX operating system. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    gathering monitor data information from a memory device having finite endurance and/or retention, the monitor data being data of known content stored in dedicated memory cells of known write cycle count;
    analyzing the monitor data information;
    estimating a reliable life of the memory device or portion thereof based on the analysis;
    tracking a rate of change of at least a highest cycle count of user data;
    estimating when the reliable life of the memory device or portion thereof will be expended based on the rate of change of the highest cycle count of user data and the estimating; and
    taking an action prior to the reliable life of the memory device or portion thereof being expended.

2. The method of claim 1, wherein tracking the rate of change of the highest cycle count of user data includes generating a time-dependent histogram that incorporates the cycle count and an approximate or actual age of the user data.

3. The method of claim 2, wherein an age of the user data is determined based on at least one of an output of a real time clock and a time stamp for an erase block.

4. The method of claim 1, wherein the monitor data is written to the dedicated memory cells at the known write cycle count prior to any memory cells for user data achieving a same number of write cycle counts.

5. The method of claim 1, wherein taking the action includes outputting an alert indicating a need for maintenance.

6. The method of claim 5, wherein the alert is output prior to the estimated time when the reliable life of the memory device or portion thereof will be expended minus an estimated time for performing the maintenance.

7. The method of claim 1, wherein taking the action includes disabling writes to the memory device or portion thereof.

8. The method of claim 1, wherein at least some of the dedicated memory cells having the monitor data have a write cycle count above and below a prespecified endurance specification cycle count, wherein the gathering the monitor data information includes reading the monitor data at more than one interval, wherein the analyzing the monitor data information includes comparing the read monitor data at each interval to known data, wherein the monitor data is not changed after it has been written at the known write cycle count.

9. The method of claim 1, wherein taking the action includes moving data from the memory device or portion thereof to another memory device.

10. The method of claim 9, wherein the data is moved prior to the estimated time when the reliable life of the memory device or portion thereof will be expended minus an estimated time for performing the maintenance.

11. The method of claim 1, wherein taking the action includes rearranging the user data on the memory device by moving the user data from a current memory cell or dells to another memory cell or cells to extend the reliable life of the memory device or portion thereof.

12. The method of claim 11, wherein the user data is rearranged on the memory device prior to the estimated time when the reliable life of the memory device or portion thereof will be expended minus an estimated time for performing the maintenance.

13. The method of claim 1, wherein taking the action includes limiting a write data rate to the memory device or portion thereof.

14. The method of claim 1, wherein the dedicated memory cells having the monitor data are write protected for preventing the monitor data from being overwritten with user data.

15. A computer program product, comprising:
    a non-transitory computer usable medium having computer usable program code embodied therewith, the computer usable program code comprising:
    computer usable program code configured to gather monitor data information from a memory device having finite endurance and/or retention, the monitor data being data of known content stored in dedicated memory cells of known write cycle count, wherein the dedicated memory cells are write protected for preventing the monitor data from being overwritten with user data;

computer usable program code configured to analyze the monitor data information;

computer usable program code configured to estimate a reliable life of the memory device or portion thereof based on the analysis;

computer usable program code configured to track a rate of change of a highest cycle count of user data;

computer usable program code configured to estimate when the reliable life of the memory device or portion thereof will be expended based on the rate of change of the highest cycle count of user data and the estimated reliable life; and computer usable program code configured to take an action prior to the reliable life of the memory device or portion thereof being expended.

16. A system, comprising:

a plurality of memory devices having finite endurance and/or retention, each of the memory devices having:
- a plurality of memory blocks, at least one of the blocks having monitor data written therein, wherein the at least one block has been written to a plurality of times prior to writing the monitor data;
- and circuitry for addressing the blocks;

a processor in communication with the memory devices;

a clock, the processor being in communication with the clock: and a computer usable medium, the computer usable medium having computer usable program code embodied therewith, which when executed by a processor causes the processor to:
- gather monitor data information from a memory device, the monitor data being data of known, content stored in dedicated memory cells of known write cycle count;
- analyze the monitor data, information;
- estimate a reliable life of the memory device or portion thereof based on the analysis;
- track a rate of change of at least a highest cycle count of user data;
- estimate when the reliable life of the memory device or portion thereof will be expended based on the rate of change of the highest cycle count of user data and the estimated reliable life; and
- take an action prior to the reliable life of the memory device or portion thereof being expended.

17. The system of claim 16, wherein the memory devices are NAND devices.

18. The system of claim 16, wherein taking the action includes at least one of:
- outputting an alert indicating a need for maintenance;
- disabling writes to the memory device or portion thereof; and
- moving data from the memory device or portion thereof to another memory device.

19. The system of claim 16, wherein taking the action includes rearranging the user data on the memory device by moving the user data from a current memory cell or cells to another memory cell or cells to extend the reliable life of the memory device or portion thereof.

20. A system, comprising:
- a module for gathering monitor data information from a memory device having finite endurance and/or retention, the monitor data being data of known content stored in dedicated memory cells of known write cycle count;
- a module for analyzing the monitor data information;
- a module for estimating a reliable life of the memory device or portion thereof based on the analysis;
- a module for tracking a rate of change of a highest cycle count of user data;
- a module for estimating when the reliable life of the memory device or portion thereof will be expended based on the rate of change of the highest cycle count of user data and the estimating; and
- a module for taking an action prior to the reliable life of the memory device or portion thereof being expended.

* * * * *